United States Patent
Chen et al.

(10) Patent No.: US 10,854,587 B2
(45) Date of Patent: Dec. 1, 2020

(54) MICRO LED DISPLAY PANEL WITH NARROWED BORDER AREA AND METHOD FOR MAKING SAME

(71) Applicant: HON HAI PRECISION INDUSTRY CO., LTD., New Taipei (TW)

(72) Inventors: Po-Fu Chen, New Taipei (TW); I-Wei Wu, New Taipei (TW); I-Min Lu, New Taipei (TW); Wei-Chih Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/524,395

(22) Filed: Jul. 29, 2019

(65) Prior Publication Data
US 2020/0058631 A1    Feb. 20, 2020

Related U.S. Application Data (60) Provisional application No. 62/765,048, filed on Aug. 17, 2018.

(51) Int. Cl.
*H01L 25/16* (2006.01)
*H01L 25/075* (2006.01)
*H01L 27/15* (2006.01)
*H01L 27/12* (2006.01)

(52) U.S. Cl.
CPC ................ *H01L 25/167* (2013.01)

(58) Field of Classification Search
CPC . H01L 25/167; H01L 25/0753; H01L 27/156; H01L 27/1214; H01L 27/124; H01L 27/1259
See application file for complete search history.

(56) References Cited

U.S. PATENT DOCUMENTS

2019/0013306 A1*   1/2019   Wu ................ H01L 25/167

* cited by examiner

*Primary Examiner* — Herve-Louis Y Assouman
(74) *Attorney, Agent, or Firm* — ScienBiziP, P.C.

(57) ABSTRACT

A micro LED display panel defines a display area and a border area surrounding the display area. The micro LED display panel includes a TFT array substrate, a plurality of micro LEDs on the TFT array substrate, a common electrode on the TFT array substrate, the common electrode covering and electrically coupling to all of the micro LEDs; a metal layer on a side of the common electrode away from the TFT array substrate and electrically coupling to the common electrode, and a black photoresist layer on a side of the metal layer away from the TFT array substrate. The black photoresist layer defines through holes. Each through hole extends through both the black photoresist layer and the metal layer and aligns with one micro LED. The metal layer and the black photoresist layer cover the display area and the border area.

12 Claims, 10 Drawing Sheets

MICRO LED DISPLAY PANEL WITH NARROWED BORDER AREA AND METHOD FOR MAKING SAME

FIELD

The subject matter herein generally relates to a micro light emitting diode (LED) display panel and a method for making the micro LED display panel.

BACKGROUND

Figure 1:
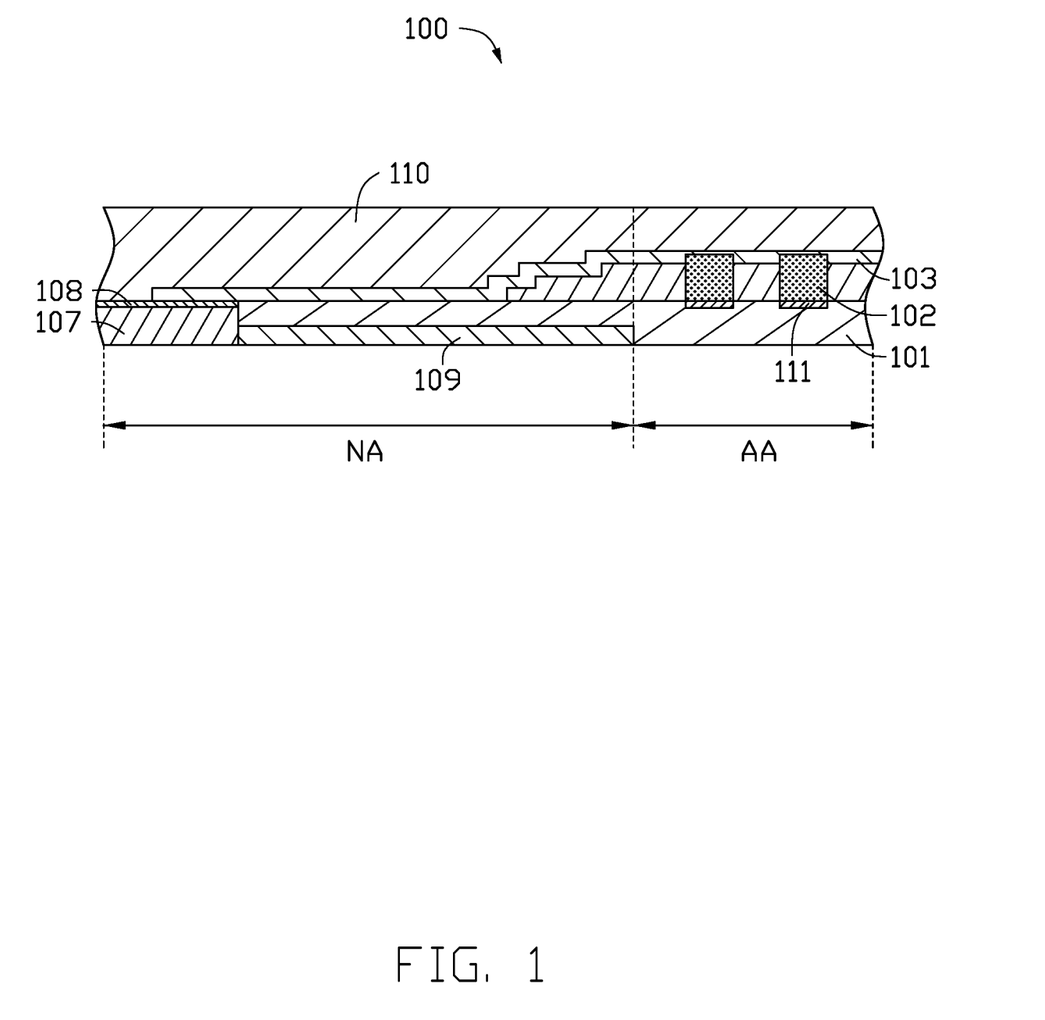
FIG. 1 is a cross-sectional view of a micro-LED display panel in prior art.

The illustration of prior art in FIG. 1 shows that a micro LED display panel 100 includes a display area AA and a border area NA surrounding the display area AA. The micro LED display panel 100 includes a thin film transistor array substrate 101, a plurality of micro-LEDs 102 on the thin film transistor array substrate 101, a common electrode 103 on the thin film transistor array substrate 101 and electrically coupled to the micro-LEDs 102, and a planarization layer 110 covering the common electrode 103. The micro LED display panel 100 further includes conductive traces 107 in the border area NA. The conductive trace 107 is electrically coupled between the common electrode 103 and a driver 109. The driver 109 is located in the border area NA and on a side of the trace 107 adjacent to the display area AA. The driver 109 is configured for driving the micro-LEDs 102 to emit light. The common electrode 103 is located in the display area AA and extends to the border area NA to electrically couple to the trace 107. To lower a resistance value of the common electrode 103, the trace 107 in the border area NA can be designed to have a larger line width but such a design results in border area NA of the micro LED display panel 100 becoming wider, which may be problematic. Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like. The term "micro LED" herein refers to an LED having a size of less than or equal to 100 micrometers (for example more than 10 micrometers and less than 100 micrometers).

First Embodiment

Figure 2:
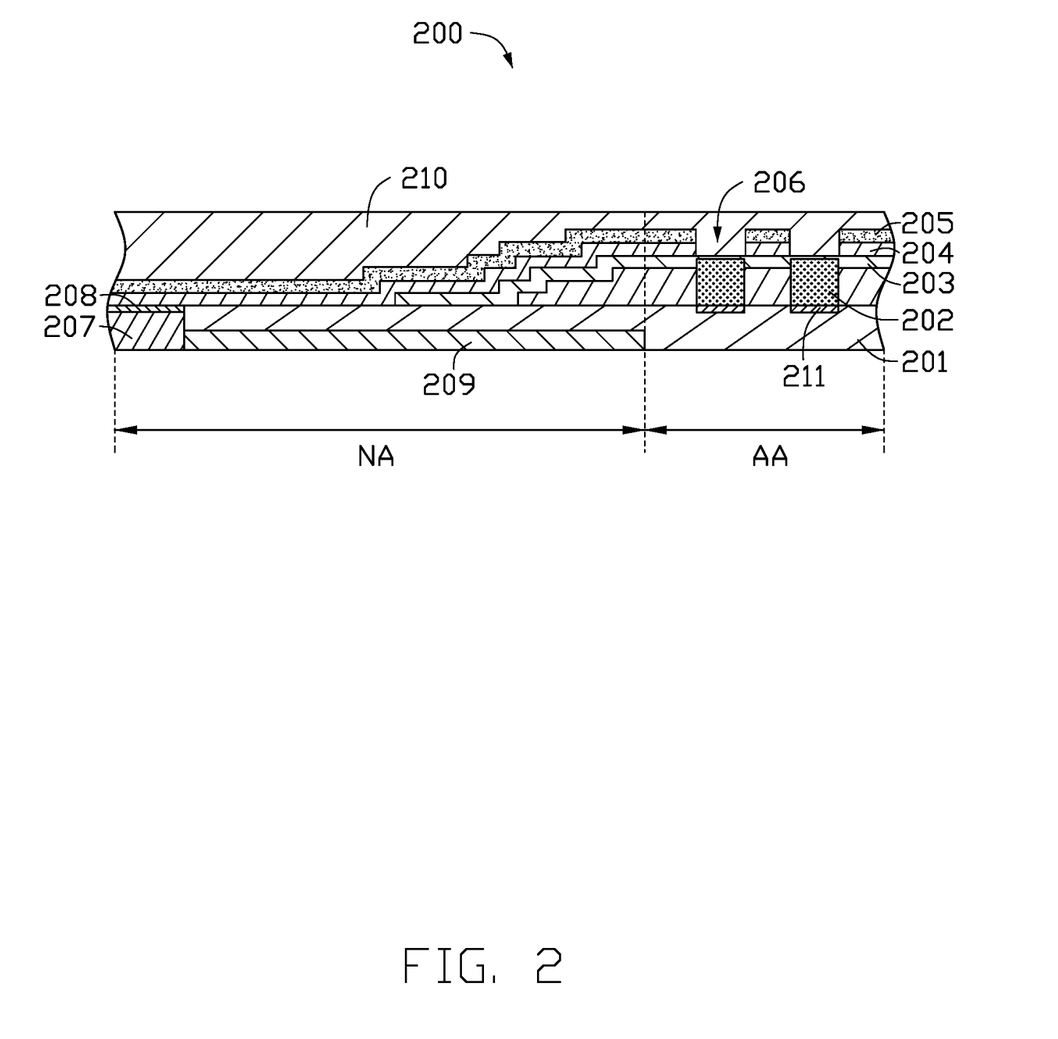
FIG. 2 is a cross-sectional view of a micro-LED display panel of a first embodiment.

FIG. 2 illustrates a micro LED display panel 200 of a first embodiment. The micro LED display panel 200 includes a display area AA and a border area NA surrounding the display area AA. The micro LED display panel 200 includes a plurality of micro LEDs 202, a thin film transistor (TFT) array substrate 201, a common electrode 203, a metal layer 204, and a black photoresist layer 205. The micro LEDs 202 are located on the TFT array substrate 201 and in the display area AA and are spaced apart from each other. The common electrode 203 is located on the TFT array substrate 201 and covers all of the micro LEDs 202. The metal layer 204 is conductive and located on a side of the common electrode 203 away from the micro LEDs 202. The metal layer 204 is in direct contact with the common electrode 203 and is electrically coupled to the common electrode 203. The black photoresist layer 205 is located on a side of the metal layer 204 away from the micro LEDs 202. The black photoresist layer 205 defines a plurality of though holes 206. Each of the through holes 206 extends through both the black photoresist layer 205 and the metal layer 204. Each of the micro LEDs 202 aligns with one of the through holes 206 and light emitted from the micro LED 202 can pass through the through hole 206. The common electrode 203, the metal layer 204, and the black photoresist layer 205 are in the display area AA and also extend to be within the border area NA.

The common electrode 203 is made of a transparent conductive material, for example indium tin oxide (ITO), and is connected to a side of each of the micro LEDs 202 away from the TFT array substrate 201. For example, the common electrode 203 of FIG. 2 is connected to a top end of each micro LED 202. The metal layer 204 is made of a metal or an alloy having a low resistance value, and the metal layer 204 may be made of, for example, one or more metals selected from molybdenum (Mo), aluminum (Al), and titanium (Ti). The metal layer 204 is directly stacked on the common electrode 203 and electrically coupled to the common electrode 203. The common electrode 203 is electrically coupled to the trace 207 by the metal layer 204. The metal layer 204 has a low resistance, thus the common electrode 203 does not need to extend significantly into the border area NA to be electrically coupled to the trace 207. An overall resistance value of the common electrode 203 and the trace 207 remains low, thus permitting a narrowing of the border area NA. Since an area of the common electrode 203 can be reduced by adding the metal layer 204, current mobility in the metal layer 204 is better than that in the common electrode 203. The metal layer 204 is also advantageous for improving a uniformity of current distribution, thereby improving the display uniformity.

The black photoresist layer 205 and the metal layer 204 have a same pattern. In other words, the black photoresist layer 205 and the metal layer 204 have a same shape; the black photoresist layer 205 completely overlaps the metal layer 205. The black photoresist layer 205 can reduce a reflection of light incident on the metal layer 204, thereby improving a display contrast. The black photoresist layer 205 completely covers the border area NA; the light cannot pass through the border area NA. The common electrode 203 partially covers the border area NA.

In this disclosure, at least one trace 207 is electrically coupled to the metal layer 204. Each trace 207 is electrically coupled to the metal layer 204 by a connection terminal 208, and each trace 207 is electrically coupled to the common electrode 203. The connection terminal 208 can be made of, for example, ITO. In this embodiment, an overall resistance of the metal layer 204 and the common electrode 203 is less than the resistance value of the common electrode 203, so that a trace having a larger line width for lower resistance is not required. As shown in FIG. 2, the trace 207 electrically connected to the common electrode 203 has a smaller line width, and the micro LED display panel 200 has a narrower border area NA compared with the micro LED display panel 100 of FIG. 1. The micro LED display panel 200 has a lower resistance value.

The micro LED display panel 200 further includes a driver 209 in the border area NA. The driver 209 is configured to supply a driving current to the micro LEDs 202. The trace 207 is electrically coupled between the metal layer 204 and the driver 209. In this embodiment, in the border area NA, the trace 207 does not overlap with the driver 209 in a normal direction of the TFT array substrate 201. The normal direction of the TFT array substrate 201 is parallel to a dotted line in FIG. 2.

The TFT array substrate 201 includes a substrate (not shown) and a plurality of thin film transistors (not shown) on the substrate. The driver 209 may be formed on the substrate of the TFT array substrate 201. The micro LED display panel 200 further includes a plurality of displaying electrodes 211. Each of the displaying electrodes 211 is formed between one of the micro LEDs 202 and the TFT array substrate 201. When there is a potential difference between the display electrode 211 and the common electrode 203, the micro LED 202 will emit light.

In this embodiment, the micro LEDs 202 includes at least three types, the micro LED 202 types emitting red light, blue light, and green light.

The micro LED display panel 200 further includes a planarization layer 210 on a side of the black photoresist layer 205 away from the metal layer 204. The planarization layer 210 completely covers both the display area AA and the border area NA and fills the through holes 206. The planarization layer 210 is made of a transparent insulating material, such as polyimide.

Second Embodiment

Figure 3:
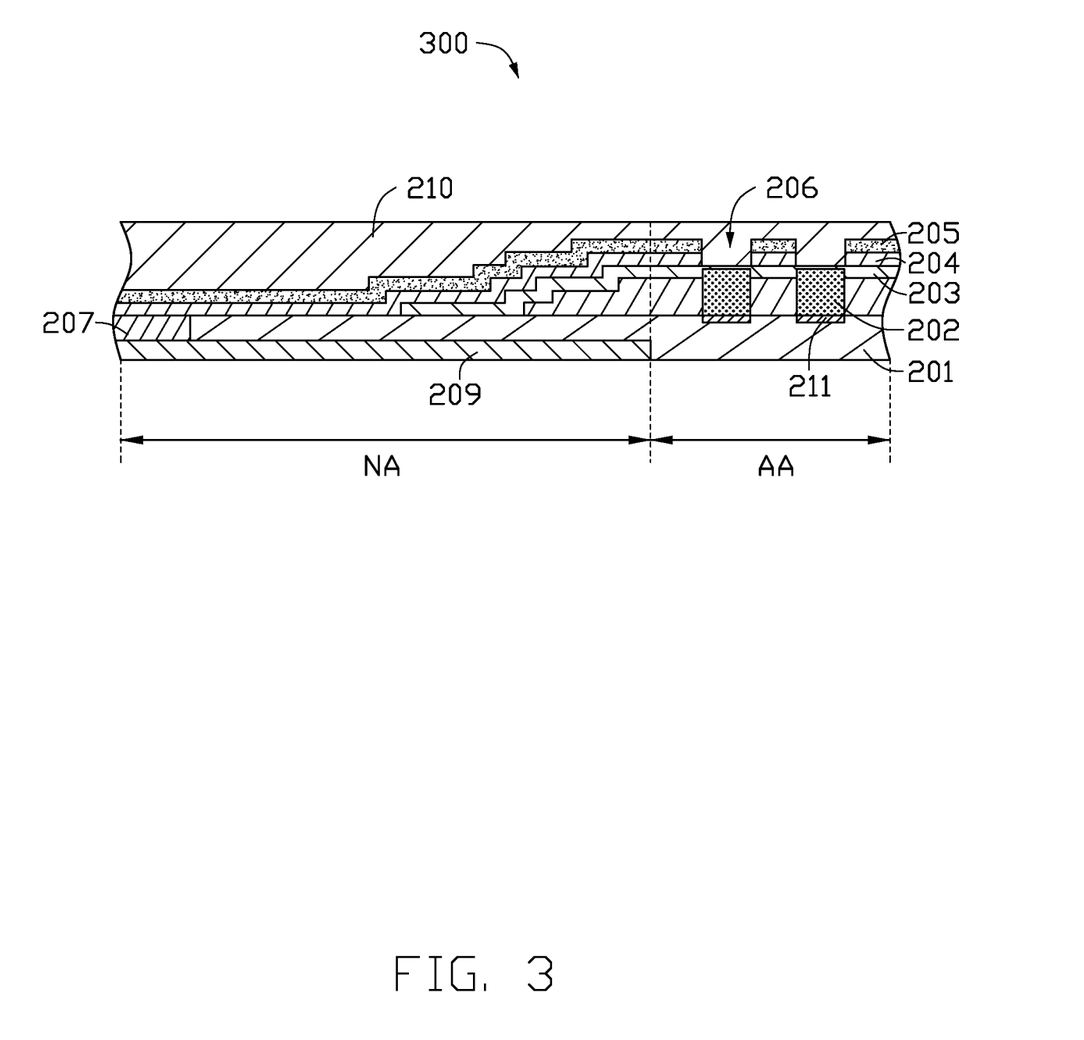
FIG. 3 is a cross-sectional view of a micro-LED display panel of a second embodiment.

FIG. 3 illustrates a micro LED display panel 300 of a second embodiment. The micro LED display panel 300 is substantially the same as the micro LED display panel 200 of the first embodiment; the differences are that the trace 207 is located above the driver 209 in the micro LED display panel 300. That is, the trace 207 overlaps with the driver 209 in the border area NA in a normal direction of the TFT array substrate 201. The normal direction of the TFT array substrate 201 is parallel to a dotted line in FIG. 3.

The micro LED display panel 300 has a border area NA which is narrower compared with the micro LED display panel 200.

Third Embodiment

Figure 4:
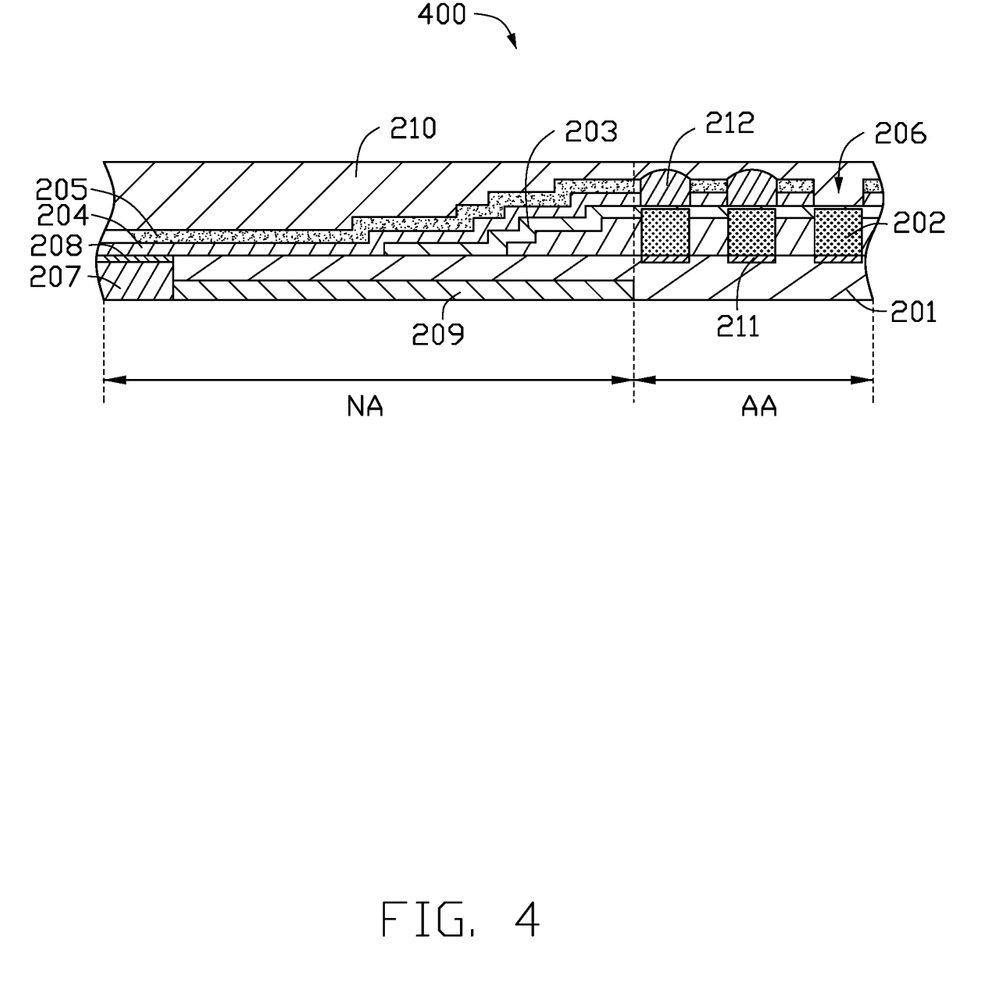
FIG. 4 is a cross-sectional view of a micro-LED display panel of a third embodiment.

FIG. 4 illustrates a micro LED display panel 400 of a third embodiment. The micro LED display panel 400 is substantially the same as the micro LED display panel 200 of the first embodiment; the differences are that some of the through holes 206 are filled with quantum dots 212. The quantum dots 212 of the micro LED display panel 400 are configured to convert the light emitted by the micro LEDs 202 into light of other colors. In this embodiment, all of the micro LEDs 202 emit blue light only, the quantum dots 212 in some through holes 206 convert the blue light into red light; and the quantum dots 212 in some through holes 206 convert the blue light into green light. Some through holes 206 are not filled with any quantum dots so the blue light can pass through directly. In this way, the red light, the green light, and the blue light can pass through the through holes 206.

Method

FIG. 5A through FIG. 5F illustrate a method of making the micro LED display panel 200 of the first embodiment. The method includes the following steps.

Figure 5A:
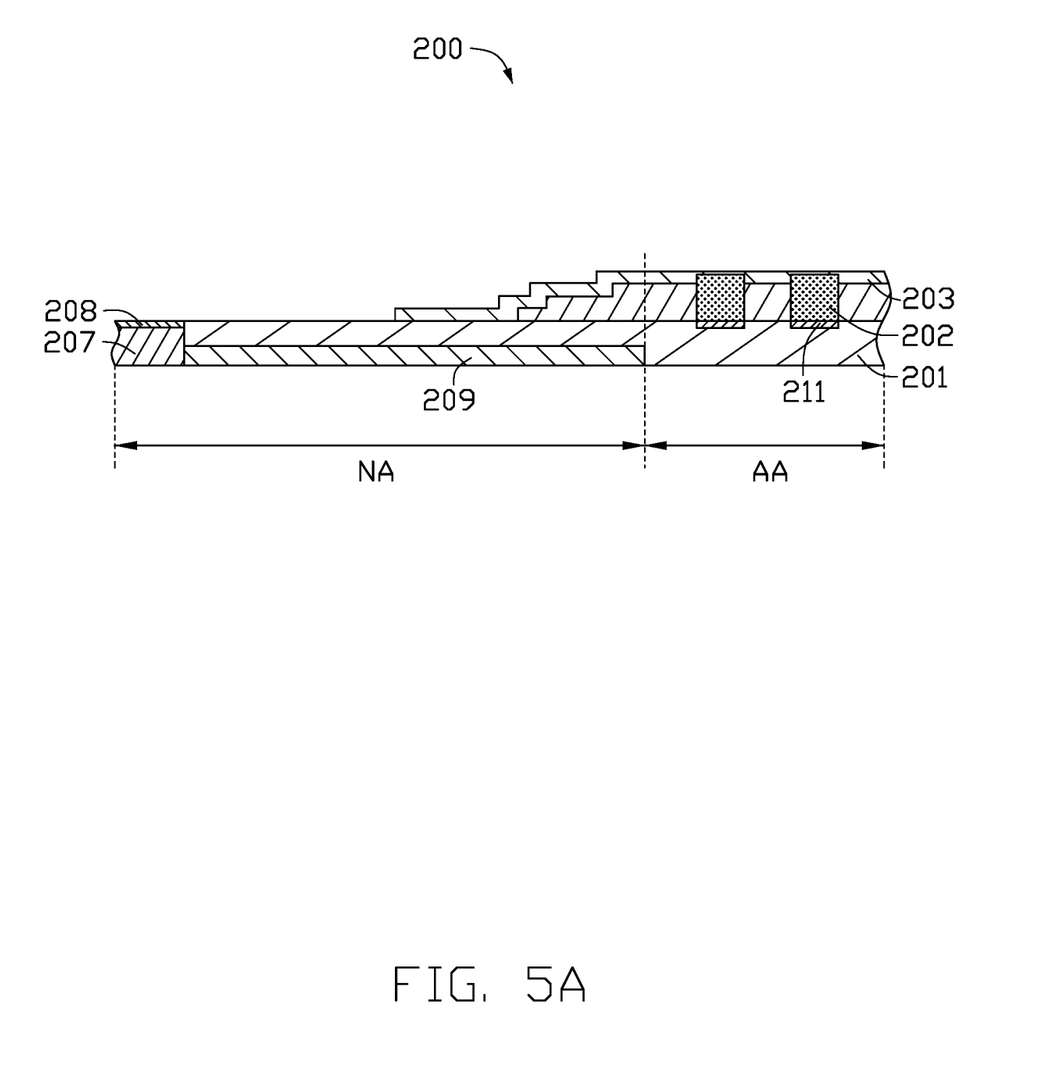
FIG. 5A, FIG. 5B, FIG. 5C, FIG. 5D, FIG. 5E, and FIG. 5F are cross-sectional views showing processes of making the micro-LED display panel of FIG. 2.

As shown in FIG. 5A, a plurality of micro LEDs 202 is formed on a TFT array substrate 201, and a common electrode 203 is formed on the TFT array substrate 201. The common electrode 203 is electrically coupled to an end of each micro LED 202 away from the TFT array substrate 201.

Figure 5B:
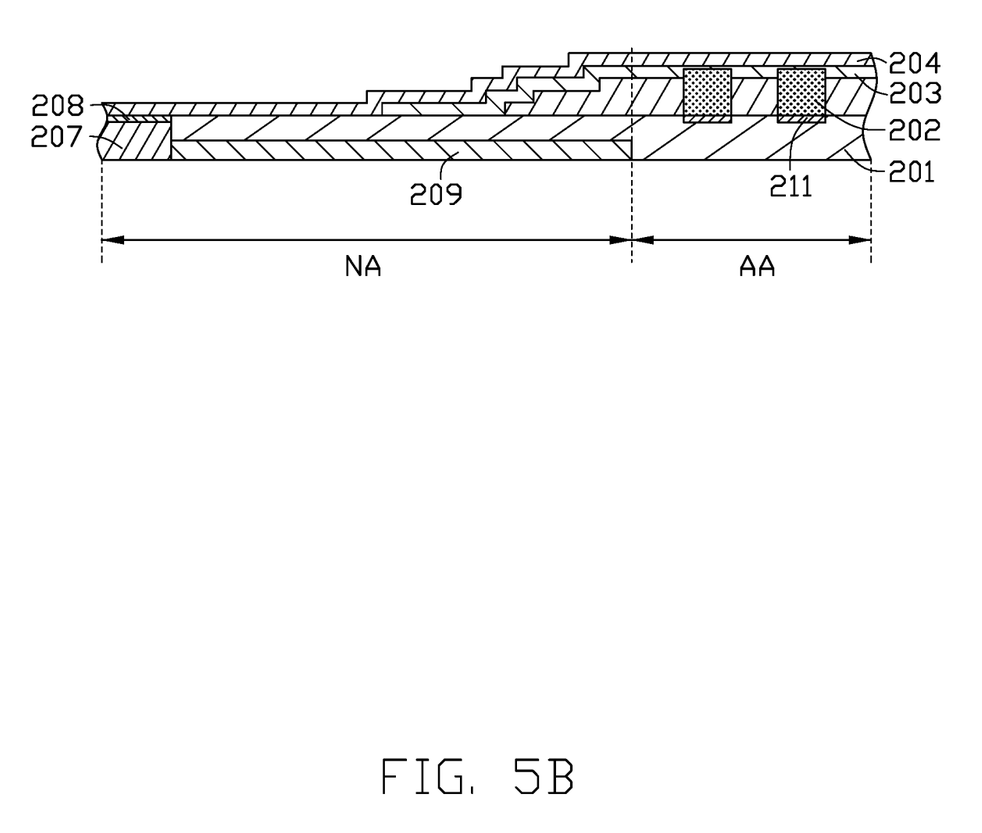

As shown in FIG. 5B, a metal layer 204 is formed on a side of the common electrode 203 away from the TFT array substrate 201.

Figure 5C:
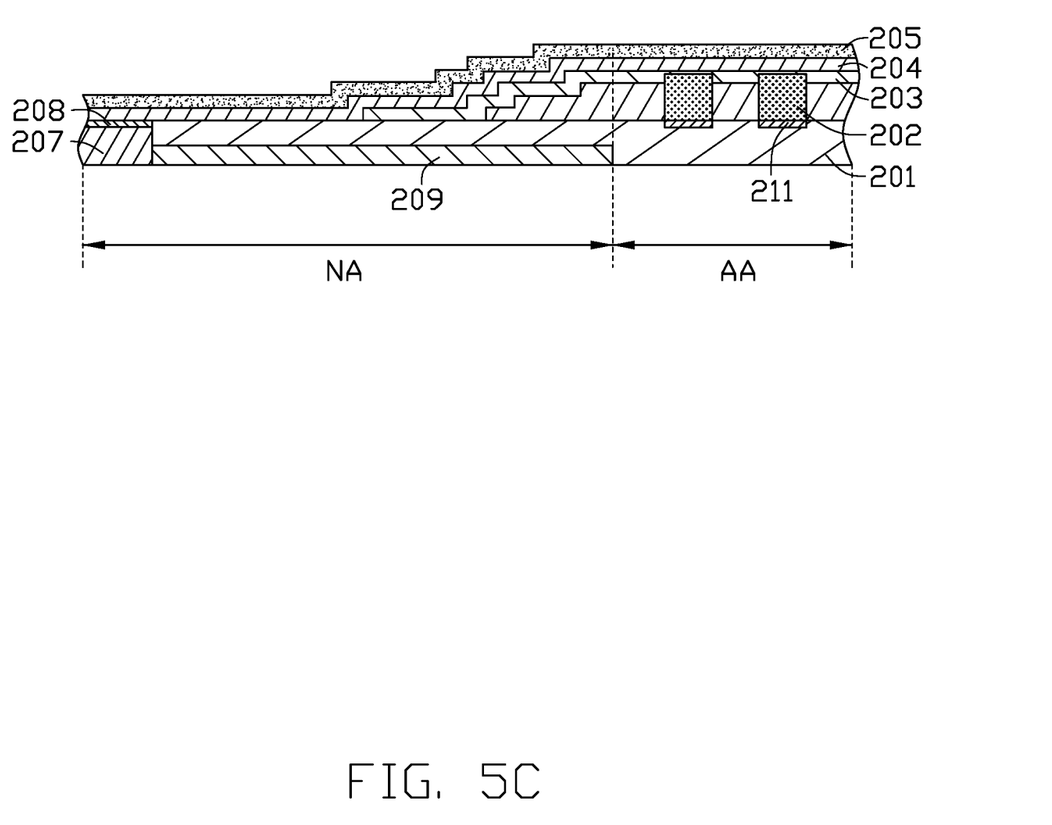

As shown in FIG. 5C, a black photoresist layer 205 is formed on the metal layer 204 away from the TFT array substrate 201.

Figure 5D:
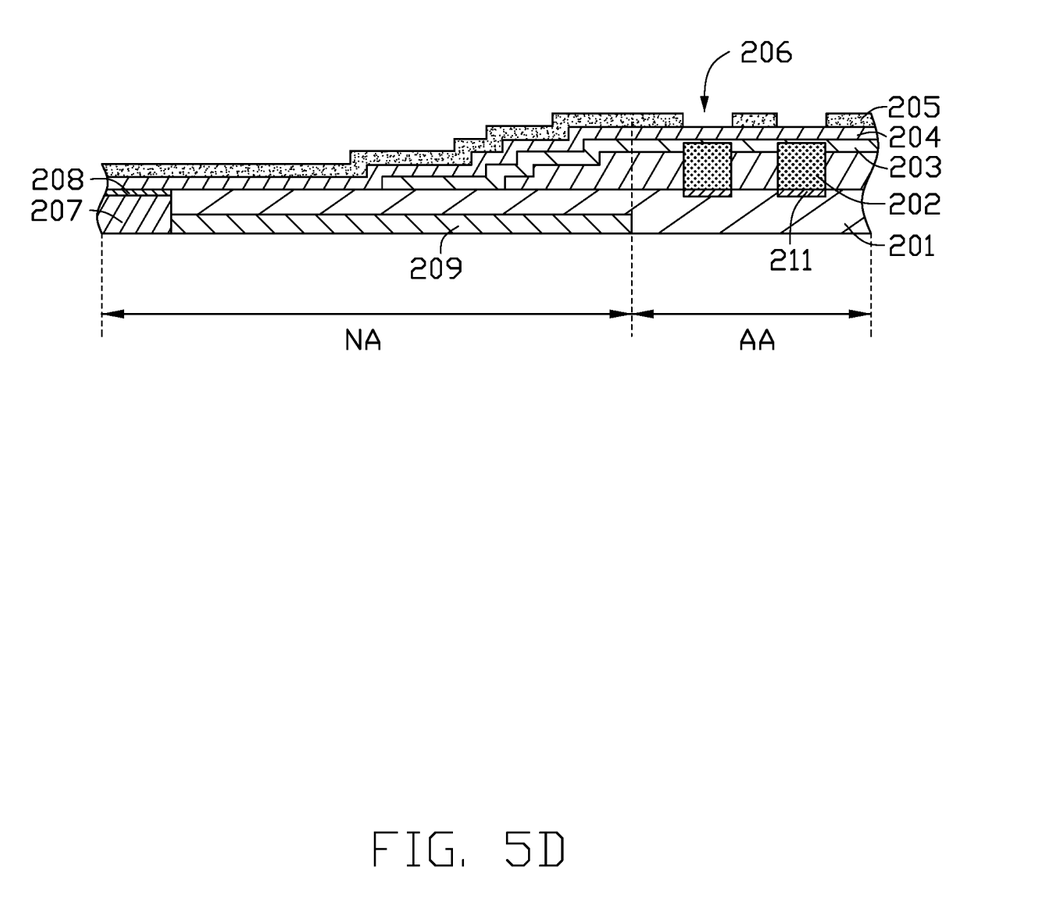
Figure 5E:
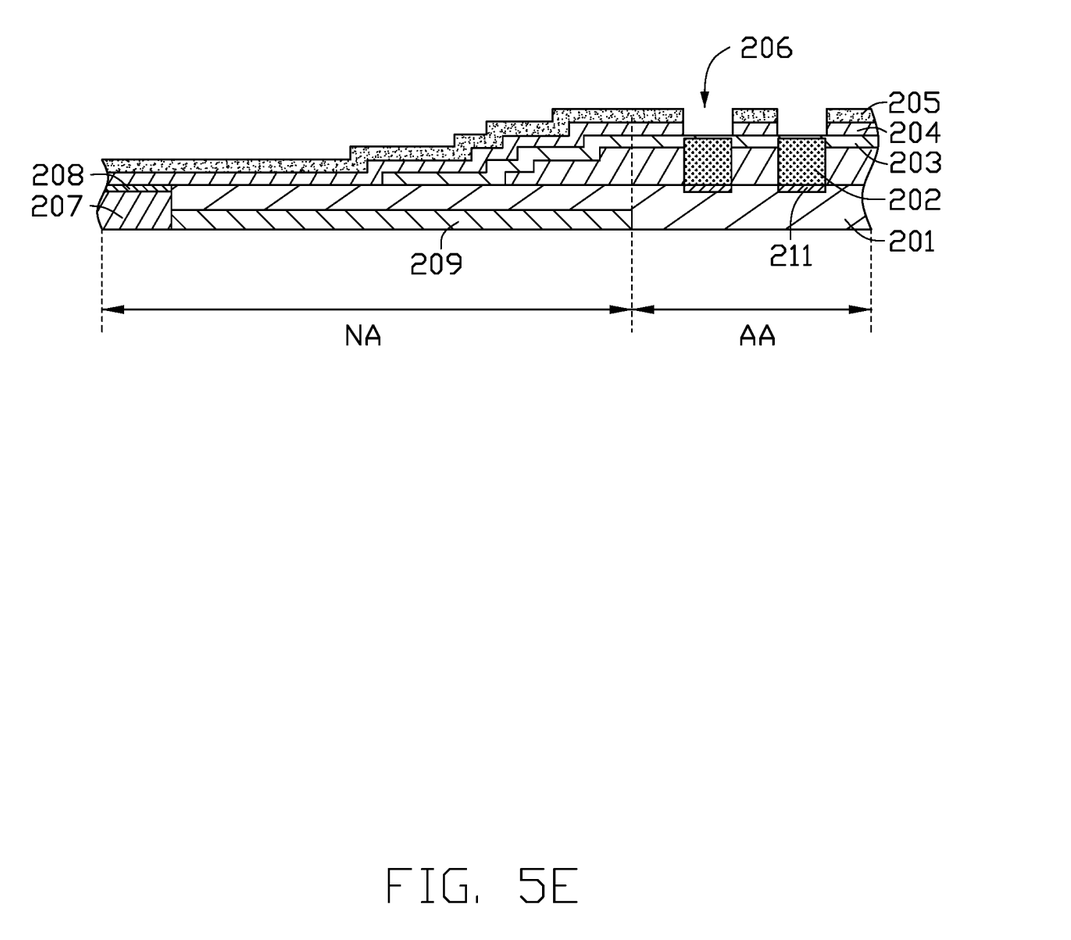

As shown in FIG. 5D and FIG. 5E, a plurality of through holes 206 is defined in the black photoresist layer 205. Each through hole 206 extends through both the black photoresist layer 205 and the metal layer 204. Each through hole 206 aligns with one micro LED 202. The through holes 206 can be formed by etching the black photoresist layer 205 and the metal layer 204.

Figure 5F:
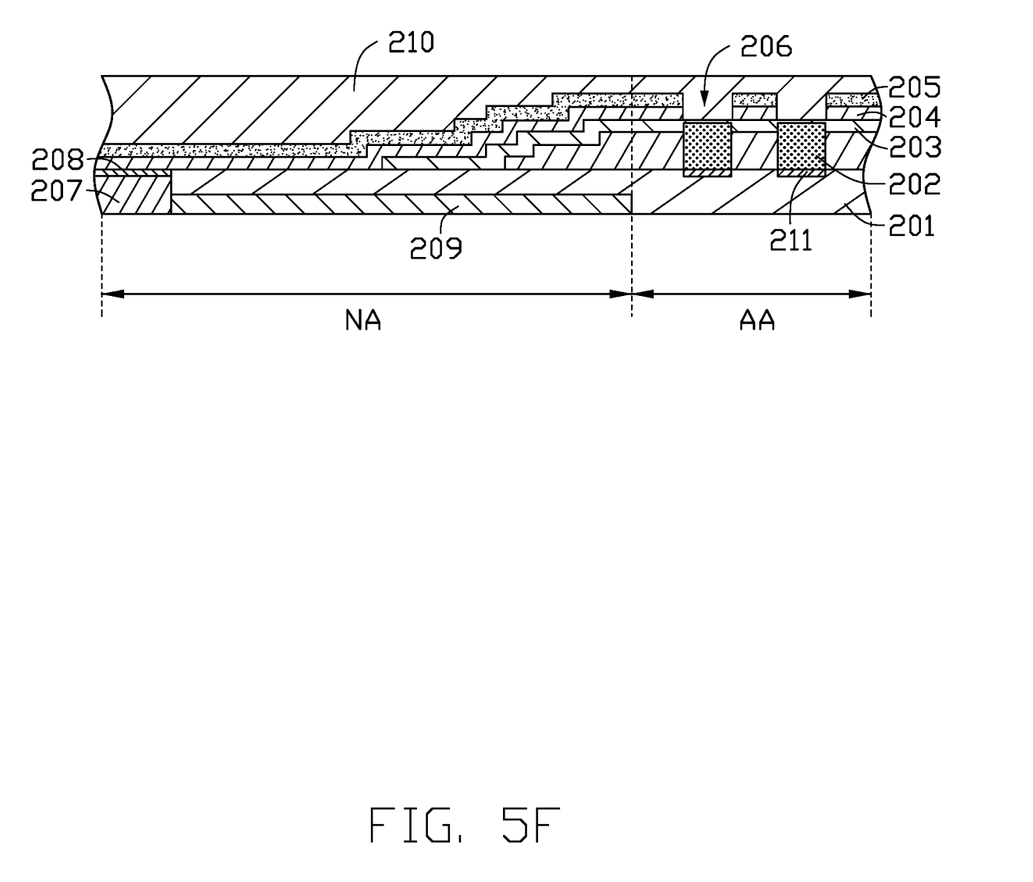

As shown in FIG. 5F, a planarization layer 210 is formed on a side of the black photoresist layer 205 away from the TFT array substrate 201.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A micro light emitting diode (LED) display panel defining a display area and a border area surrounding the display area, comprising:
a thin film transistor (TFT) array substrate;
a plurality of micro LEDs on the TFT array substrate, the plurality of micro LEDs being spaced apart from each other;

a common electrode on the TFT array substrate, the common electrode covering and electrically coupling to each and all of the plurality of micro LEDs;

a metal layer on a side of the common electrode away from the TFT array substrate and being electrically coupled to the common electrode; and a black photoresist layer on a side of the metal layer away from the TFT array substrate, the black photoresist layer defining a plurality of through holes, each of the plurality of through holes being extended through both the black photoresist layer and the metal layer and aligned with one of the plurality of micro LEDs;

wherein the metal layer and the black photoresist layer cover the display area and the border area.

2. The micro LED display panel of claim 1, wherein the metal layer is in direct contact with the common electrode.

3. The micro LED display panel of claim 1, wherein the metal layer is made of one or more materials selected from molybdenum (Mo), aluminum (Al), and titanium (Ti).

4. The micro LED display panel of claim 1, further comprising a trace electrically coupled to the metal layer; wherein the trace is in the border area.

5. The micro LED display panel of claim 4, further comprising a driver in the border area; wherein the trace is electrically coupled between the metal layer and the driver.

6. The micro LED display panel of claim 5, wherein in the border area, the trace does not overlap with the driver.

7. The micro LED display panel of claim 5, wherein in the border area, the trace overlaps with the driver.

8. The micro LED display panel of claim 1, wherein a portion of the plurality of through holes are filled with quantum dots; the quantum dots are configured to convert light emitted by the micro LEDs into light of colors different from a color of the light from the micro LEDs.

9. The micro LED display panel of claim 1, further comprising a planarization layer covering the common electrode.

10. The micro LED display panel of claim 9, wherein the planarization layer fills the plurality of through holes.

11. The micro LED display panel of claim 9, wherein the black photoresist layer covers an entirety of the border area; the black photoresist layer completely overlaps with the metal layer.

12. A method for making a micro light emitting diode (LED) display panel, comprising:

forming a plurality of micro LEDs on a thin film transistor (TFT) array substrate;

forming a common electrode on the TFT array substrate and covering an end of each of the plurality of micro LEDs away from the TFT array substrate;

forming a metal layer on a side of the common electrode away from the TFT array substrate;

forming a black photoresist layer on the metal layer away from the TFT array substrate; and defining a plurality of through holes in the black photoresist layer, wherein each of the plurality of through holes extends through both the black photoresist layer and the metal layer, and each of the plurality of through holes is aligned with one of the plurality of micro LEDs.

* * * * *